(12) United States Patent
Oh et al.

(10) Patent No.: US 12,376,305 B2
(45) Date of Patent: Jul. 29, 2025

(54) MEMORY DEVICE AND MANUFACTURING METHOD THEREOF

(71) Applicant: SK hynix Inc., Icheon-si (KR)

(72) Inventors: Sung Lae Oh, Icheon-si (KR); Sang Hyun Sung, Icheon-si (KR); Hyun Soo Shin, Icheon-si (KR)

(73) Assignee: SK hynix Inc., Icheon-si (KR)

(*) Notice: Subject to any disclaimer, the term of this patent is extended or adjusted under 35 U.S.C. 154(b) by 418 days.

(21) Appl. No.: 18/157,828

(22) Filed: Jan. 22, 2023

(65) Prior Publication Data
US 2023/0240069 A1  Jul. 27, 2023

(30) Foreign Application Priority Data
Jan. 27, 2022 (KR) .......................... 10-2022-0012022

(51) Int. Cl.
*H10B 43/27* (2023.01)
*H10B 43/10* (2023.01)
*H10B 43/50* (2023.01)

(52) U.S. Cl.
CPC ............. *H10B 43/27* (2023.02); *H10B 43/10* (2023.02); *H10B 43/50* (2023.02)

(58) Field of Classification Search
CPC .......... H10B 12/10; H10B 12/27; H10B 12/50
See application file for complete search history.

(56) References Cited

U.S. PATENT DOCUMENTS
2019/0198404 A1   6/2019  Kim et al.

FOREIGN PATENT DOCUMENTS
KR   10-2004-0038560 A   5/2004
KR   10-0838658 B1        6/2008

*Primary Examiner* — Zandra V Smith
*Assistant Examiner* — Molly K Reida

(57) ABSTRACT

A memory device may include an electrode structure including a plurality of electrode layers and a plurality of interlayer dielectric layers that are alternately stacked on a substrate; a trench in the electrode structure, and having an upper sidewall, a lower sidewall and a horizontal portion that couples the upper sidewall to the lower sidewall and that is parallel to a top surface of the substrate; a dielectric layer in the trench; and a slimming hole in the electrode structure having a sidewall of the trench and a region of the dielectric layer, and having a bottom surface disposed on an electrode layer on which the horizontal portion of the trench is positioned.

12 Claims, 27 Drawing Sheets

MEMORY DEVICE AND MANUFACTURING METHOD THEREOF

CROSS-REFERENCE TO RELATED APPLICATION

The present application claims priority under 35 U.S.C. § 119(a) to Korean Patent Application No. 10-2022-0012022 filed in the Korean Intellectual Property Office on Jan. 27, 2022, which is incorporated herein by reference in its entirety.

BACKGROUND

1. Technical Field

Various embodiments generally relate to a semiconductor technology, and particularly, to a memory device and a manufacturing method thereof.

2. Related Art

A memory device with a two-dimensional or planar structure has been developed to store more data in the same area by using a fine patterning process. However, as the line width of a circuit is narrowed due to the demand for high integration, interference between memory cells becomes severe, thereby causing various limitations such as degradation in performance. Of course, in addition to such structural limitations, there is a problem in that an increase in manufacturing cost is inevitable because expensive equipment is required to pattern a fine line width.

As an alternative to overcome limitations of two-dimensional memory devices, three-dimensional memory devices have been proposed. A three-dimensional memory device has advantages in that a larger capacity may be realized within the same area by increasing the number of stacks through stacking memory cells in a vertical direction, thereby providing high performance and excellent power efficiency.

In a three-dimensional memory device, in order to independently apply electrical signals to electrode layers disposed at different heights, contacts should be coupled to the respective electrode layers, and various technologies for this end are being developed.

SUMMARY

Various embodiments are directed to a memory device and a manufacturing method thereof capable of reducing process defects.

In an embodiment, a memory device may include: an electrode structure including a plurality of electrode layers and a plurality of interlayer dielectric layers that are alternately stacked on a substrate; a trench in the electrode structure, and having an upper sidewall, a lower sidewall and a horizontal portion that couples the upper sidewall to the lower sidewall and that is parallel to a top surface of the substrate; a dielectric layer in the trench; and a slimming hole in the electrode structure having a sidewall of the trench and a sidewall of the dielectric layer, and having a bottom surface disposed on an electrode layer on which the horizontal portion of the trench is positioned.

In an embodiment, a method for manufacturing a memory device may include: forming a multi-layered stack by alternately stacking a plurality of first material layers and a plurality of second material layers on a substrate; forming, in the multi-layered stack, a trench having an upper sidewall, a lower sidewall and a horizontal portion that couples the upper sidewall and the lower sidewall and that is parallel to a top surface of the substrate; filling the trench with a dielectric layer; forming, on the multi-layered stack and the dielectric layer, a mask pattern having an opening that exposes a region including a sidewall of the trench; forming a slimming hole by etching the multi-layered stack and the dielectric layer using the mask pattern as an etch mask; and detecting the horizontal portion.

In an embodiment, a memory device may include: an electrode structure including a plurality of electrode layers and a plurality of interlayer dielectric layers that are alternately stacked on a substrate; a trench formed in the electrode structure, and having an inclined sidewall; a slimming hole formed in a region of the electrode structure including the sidewall of the trench; and a recess formed on the sidewall of the trench under the slimming hole.

In an embodiment, a method for manufacturing a memory device may include: forming a multi-layered stack by alternately stacking a plurality of first material layers and a plurality of second material layers on a substrate; forming, in the multi-layered stack, a trench having an inclined sidewall; forming, on the multi-layered stack, a mask pattern having an opening that exposes a region including a sidewall of the trench; forming a slimming hole by etching the multi-layered stack using the mask pattern as an etch mask, and forming a recess on the sidewall of the trench under the slimming hole; and calculating a depth of the slimming hole on the basis of a distance between the sidewall of the trench and a sidewall of the recess.

DETAILED DESCRIPTION

Figure 1:
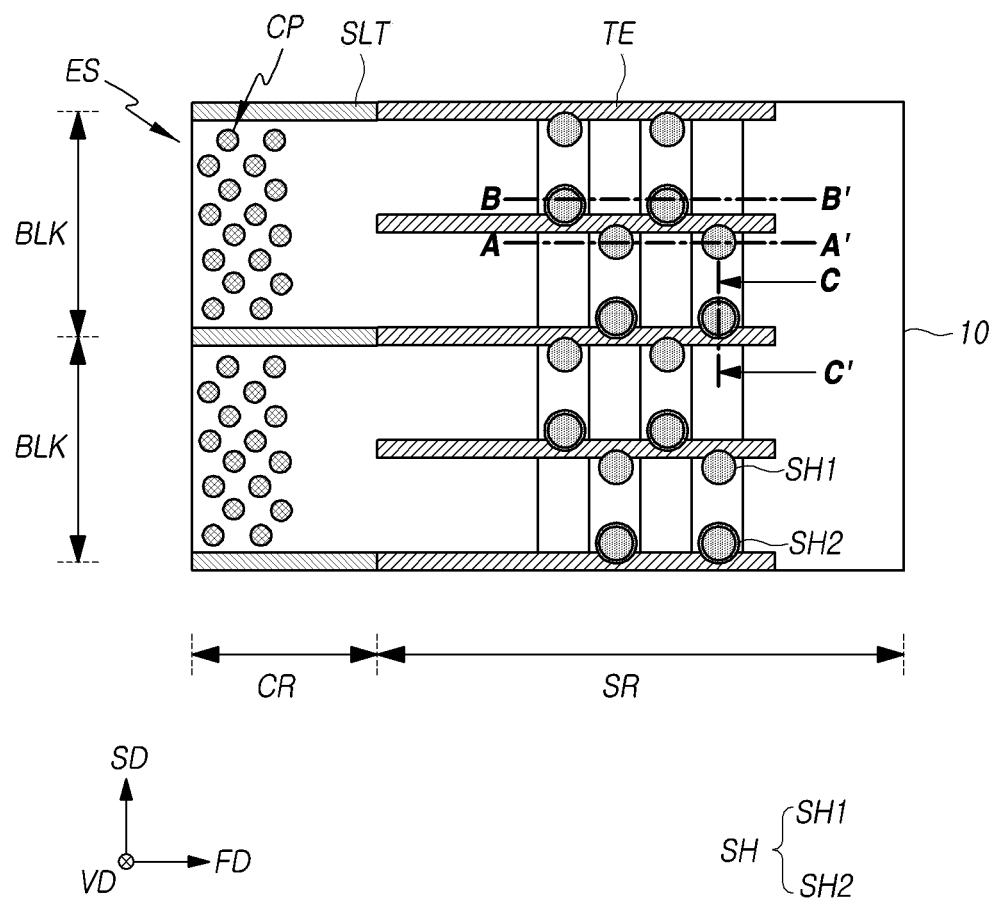
FIG. 1 is a schematic top view of a memory device in accordance with an embodiment of the disclosure.

Advantages and features of the disclosure and methods to achieve them will become apparent from the descriptions of exemplary embodiments herein below with reference to the accompanying drawings. However, the present disclosure is not limited to the exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

Since the figures, dimensions, ratios, angles, numbers of elements given in the drawings to describe embodiments of the disclosure are merely illustrative, the present disclosure is not limited to the illustrated matters. Throughout the specification, like reference numerals refer to like components. In describing the disclosure, when it is determined that the detailed description of the related art may obscure the gist of the disclosure, the detailed description thereof will be omitted. It is to be noticed that the terms "comprising," "having," "including" and so on, used in the description and claims, should not be interpreted as being restricted to the means listed thereafter unless specifically stated otherwise. Where an indefinite or definite article, e.g., "a," "an" or "the," is used when referring to a singular noun, this may include a plural of that noun unless specifically stated otherwise.

In interpreting elements in embodiments of the disclosure, they should be interpreted as including error margins even without explicit statements.

Also, in describing the components of the disclosure, there may be used terms such as first, second, A, B, (a), and (b). These are solely for the purpose of differentiating one component from another component but do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationships, such as "an element A on an element B," "an element A above an element B," "an element A below an element B" and "an element A next to an element B," one or more other elements may be disposed between the elements A and B unless the term "directly" or "immediately" is explicitly used.

Features of various exemplary embodiments of the disclosure may be coupled, combined or separated partially or totally. Various interactions and operations are technically possible. Various exemplary embodiments can be practiced individually or in combination.

Hereinafter, embodiments of the disclosed technology will be described in detail with reference to the accompanying drawings.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may be the extending direction of row lines and the arrangement direction of bit lines, and the second direction SD may be the extending direction of the bit lines and the arrangement direction of the row lines. The first direction FD and the second direction SD may substantially perpendicularly intersect with each other.

Figure 2:
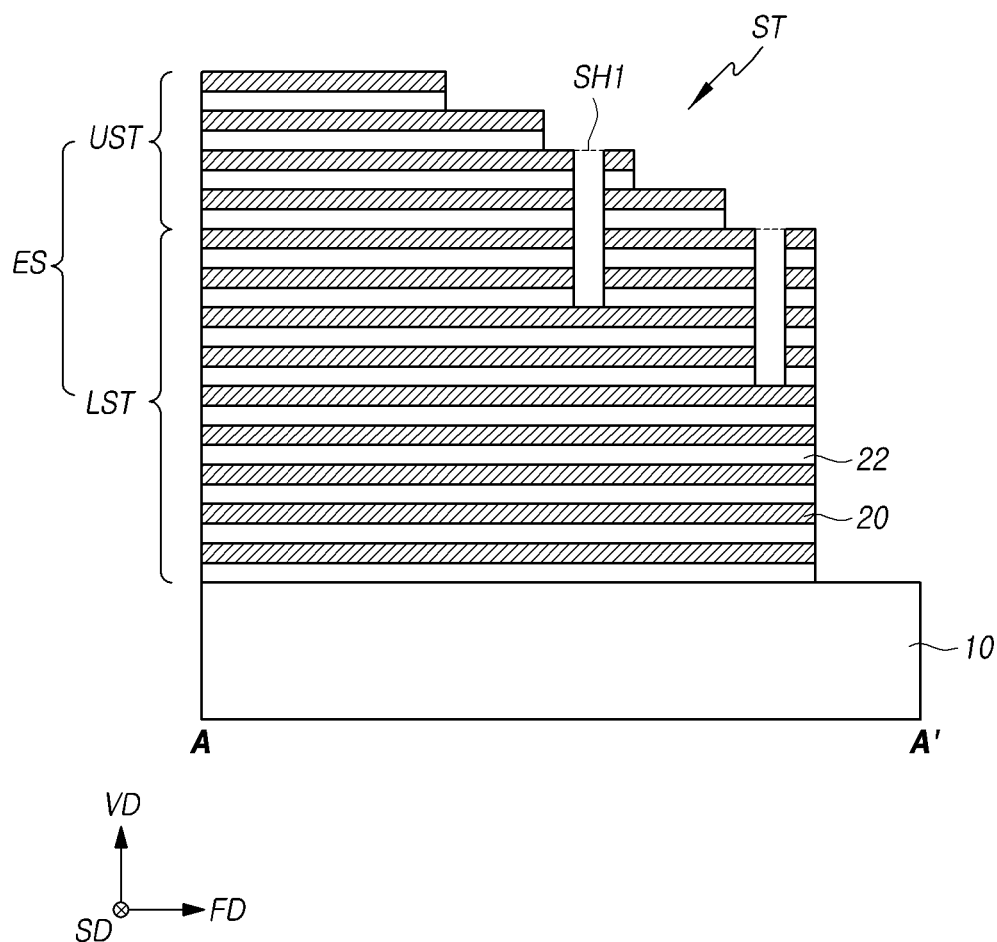
FIG. 2 is a cross-sectional view taken along the line A-A' of FIG. 1.
Figure 3:
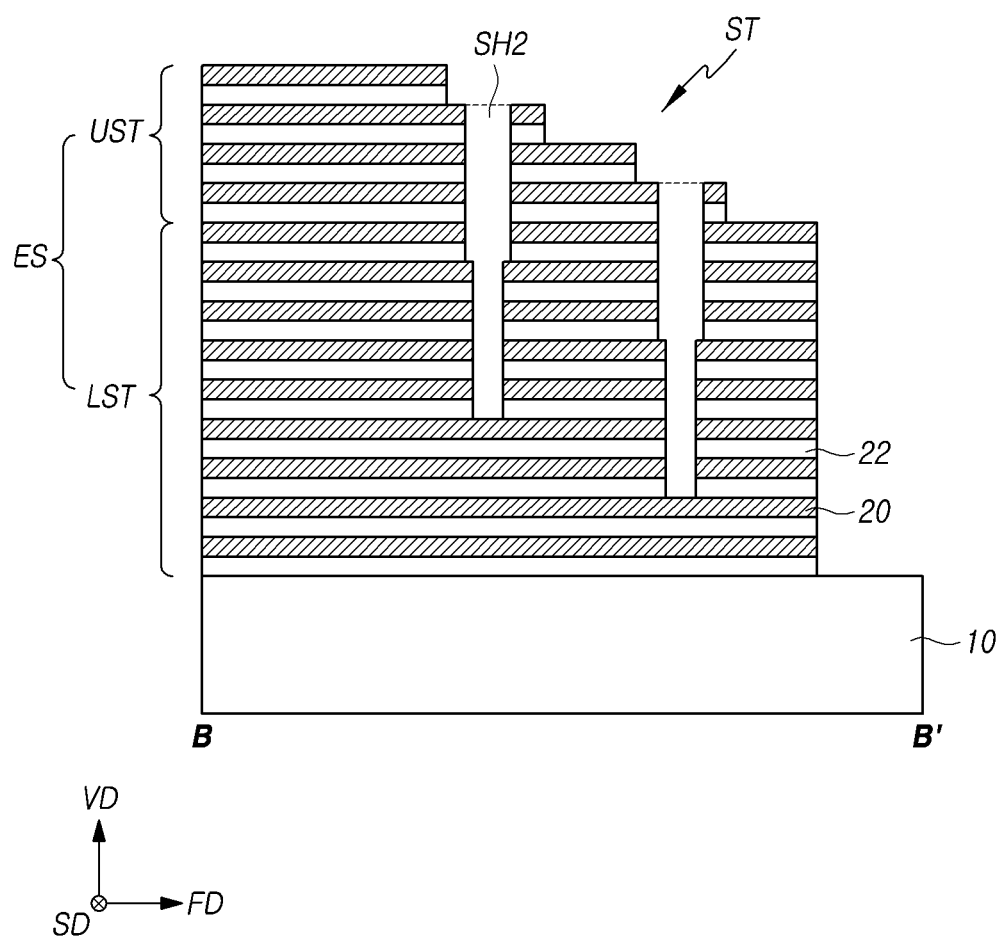
FIG. 3 is a cross-sectional view taken along the line B-B' of FIG. 1.

FIG. 1 is a schematic top view of a memory device in accordance with an embodiment of the disclosure, FIG. 2 is a cross-sectional view taken along the line A-A' of FIG. 1, and FIG. 3 is a cross-sectional view taken along the line B-B' of FIG. 1.

Referring to FIGS. 1 to 3, a memory device in accordance with an embodiment of the disclosure may include an electrode structure ES, which is disposed on a cell region CR and a slimming region SR of a substrate 10. The slimming region SR may be configured to be adjacent to the cell region CR in the first direction FD as a direction in which row lines extend.

For example, the substrate 10 may include at least one among silicon (Si), germanium (Ge), silicon germanium (SiGe), gallium arsenide (GaAs), indium gallium arsenide (InGaAs), aluminum gallium arsenide (AlGaAs) and a compound thereof. The substrate 10 may be a bulk silicon substrate, a silicon on insulator (SOI) substrate, a germanium substrate, a germanium on insulator (GOI) substrate, a silicon germanium substrate, or a substrate of an epitaxial thin film obtained by performing selective epitaxial growth (SEG).

The electrode structure ES may include a lower stack LST and an upper stack UST, which is stacked on the lower stack LST. The lower stack LST and the upper stack UST may include a plurality of electrode layers 20 and a plurality of interlayer dielectric layers 22, which are alternately stacked.

The electrode layers 20 may include a conductive material, and the interlayer dielectric layers 22 may include a dielectric material. For example, the electrode layers 20 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). The interlayer dielectric layers 22 may include silicon oxide.

The electrode layers 20 may configure row lines. In detail, among the electrode layers 20, at least one electrode layer 20 from the lowermost electrode layers 20 may configure a source select line. Among the electrode layers 20, at least one electrode layer 20 from the uppermost electrode layers 20 may configure a drain select line. The electrode layers 20 between the source select line and the drain select line may configure word lines.

A stairway structure ST may be formed in the slimming region SR of the upper stack UST. The stair height of the stairway structure ST may be the same as the vertical pitch of the electrode layers 20. The vertical pitch of the electrode layers 20 is the distance between the top surfaces of two adjacent electrode layers 20. For example, the stairway structure ST may have a shape with steps going down as a distance from the cell region CR increases. Exposed upper surfaces of the stairway structure ST may be closer to the top surface of the substrate 10 as a distance from the cell region CR increases.

A plurality of cell plugs CP may be configured in the cell region CR of the electrode structure ES. The plurality of cell plugs CP may extend to the substrate 10 by passing through the cell region CR of the electrode structure ES in the vertical direction VD. Although not illustrated in detail, each of the cell plugs CP may include a channel layer and a gate dielectric layer. The channel layer may include polysilicon or monocrystalline silicon, and may include, in some regions thereof, a P-type impurity such as boron (B). The gate dielectric layer may have a shape that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. Although not illustrated, the cell plug CP may be coupled to a corresponding bit line through a bit line contact.

A plurality of slits SLT may be formed in the cell region CR of the electrode structure ES, and a plurality of trenches TE may be formed in the slimming region SR of the electrode structure ES. The plurality of slits SLT may pass through the cell region CR of the electrode structure ES, may extend in the first direction FD as a direction in which row lines extend, and may be arranged in the second direction SD. The plurality of trenches TE may pass through the slimming region SR of the electrode structure ES, may extend in the first direction FD, and may be arranged then the second direction SD.

The plurality of slits SLT may be configured to traverse the cell region CR of the electrode structure ES in the first direction FD, and the plurality of trenches TE may be configured to traverse the slimming region SR of the electrode structure ES in the first direction FD.

The pitch of the trench TE may be smaller than the pitch of the slit SLT. The pitch of the trench TE means the distance between center portions of two adjacent trenches TE in the second direction SD, and the pitch of the slit SLT means the distance between center portions of two adjacent slits SLT in the second direction SD.

Some of the plurality of trenches TE may be disposed on the same lines as corresponding slits SLT to divide the electrode structure ES. The electrode structure ES may be divided into units of memory blocks BLK by the plurality of slits SLT and the trenches TE corresponding thereto. One slit SLT and one trench TE may be disposed and coupled to each other between two memory blocks BLK that are adjacent in the second direction SD, to divide the electrode structure ES.

A plurality of slimming holes SH may be formed to define pad regions of the electrode layers 20 corresponding to the slimming region SR of the electrode structure ES. The slimming hole SH may be formed in the vertical direction VD in a region of the electrode structure ES that includes a portion of a sidewall of the trench TE. In an example, each slimming hole SH may be configured to pass through one sidewall of a corresponding trench TE. As a result, the slimming hole SH may expose the pad region of an electrode layer 20 of one memory block BLK that is positioned on one side of the corresponding trench TE.

The plurality of slimming holes SH may include a plurality of first slimming holes SH1 and a plurality of second slimming holes SH2. The first slimming holes SH1 and the second slimming holes SH2 may be formed in the stair surfaces, respectively, of the stairway structure ST.

The first slimming holes SH1 may be formed at the same time through a Z-slim process. The second slimming holes SH2 may be formed at the same time through Z-slim processes. In an embodiment, one Z-slim process is used to form the first slimming holes SH1 and two Z-slim processes are used to form the second slimming holes SH2. The Z-slim process is a process of forming a mask pattern having a plurality of openings that expose the stair surfaces, respectively, of the stairway structure ST, and of etching a plurality of first material layers and a plurality of second material layers by using the mask pattern as an etch mask. The pad regions of the plurality of electrode layers 20 may be defined by using Z-slim processes.

The first slimming holes SH1, which are formed through the same Z-slim process, may have the same depth as each other. The bottom surfaces of the first slimming holes SH1 may be positioned at the same distance from corresponding overlying stair surfaces, respectively, in the vertical direction VD. The second slimming holes SH2, which are formed through the same Z-slim processes, may have the same depth as each other. The bottom surfaces of the second slimming holes SH2 may be positioned at the same distance from corresponding overlying stair surfaces, respectively, in the vertical direction VD. The depth of the second slimming holes SH2 may be deeper than that of the first slimming holes SH1.

Although not illustrated, contacts may be coupled to the pad regions, respectively, of the electrode layers 20 that are exposed by the first and second slimming holes SH1 and SH2. The electrode layers 20 may be coupled to a row decoder through the contacts, and may be provided with operating voltages from the row decoder.

As described above, when the slimming holes SH are formed using the Z-slim process, the pad regions of the plurality of electrode layers 20 may be defined at the same time, and thus, an advantage is provided in that the number of etching processes used to define the pad regions may be reduced. However, in the process of forming the slimming holes SH, it is not easy to accurately check whether the slimming holes SH are etched by to the correct depth. If the etching depth of the Z-slim process is not precisely controlled, and if the slimming holes SH are not formed to target depths, then a defect may occur when a contact is not coupled to an electrode layer 20 or when two or more contacts are coupled to one electrode layer 20. In order to form the slimming holes SH to the target depth, a method for precisely monitoring the depths of the slimming holes SH is required.

Figure 4:
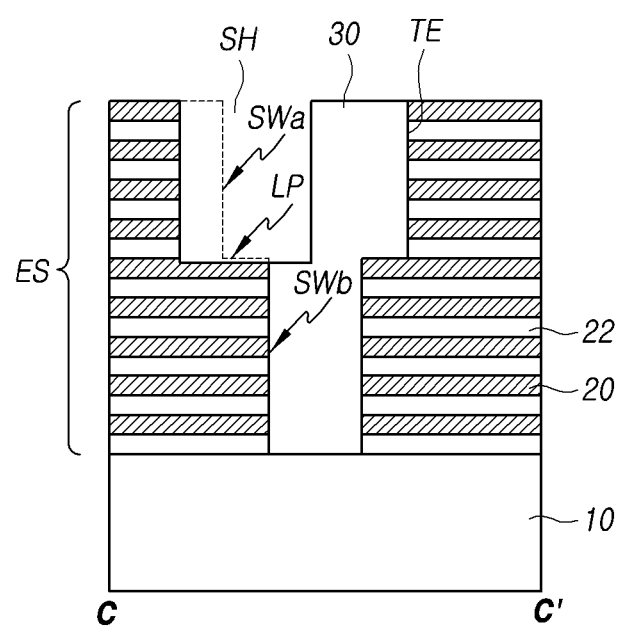
FIG. 4 is a cross-sectional view taken along the line C-C' of FIG. 1.

FIG. 4 is a cross-sectional view taken along the line C-C' of FIG. 1.

Referring to FIG. 4, a memory device may include an electrode structure ES including a plurality of electrode layers 20 and a plurality of interlayer dielectric layers 22 which are alternately stacked on a substrate 10; a trench TE formed in the electrode structure ES and having an upper sidewall SWa, a lower sidewall SWb and a horizontal portion LP, which couples the upper sidewall SWa and the lower sidewall SWb and is parallel to the top surface of the substrate 10; a dielectric layer 30 filling the trench TE; and a slimming hole SH. The slimming hole SH is formed in the electrode structure ES and located to include an upper sidewall of the trench TE and a region of the dielectric layer 30 and having a bottom surface disposed on an electrode layer 20 that is common to the horizontal portion LP.

The trench TE may include the horizontal portion LP and the upper sidewall SWa and the lower sidewall SWb, which are coupled to the horizontal portion LP. Although FIG. 4 illustrates a trench TE completely passing through the electrode structure ES, the disclosed technology is not limited thereto. The trench TE may partially pass through the electrode structure ES. In addition, although FIG. 4 illustrates that the upper sidewall SWa and the lower sidewall SWb are perpendicular to the top surface of the substrate 10, the disclosed technology is not limited thereto. The upper sidewall SWa and the lower sidewall SWb may have an inclination other than 0 degrees with respect to the top surface of the substrate 10.

The dielectric layer 30 may be formed of the same material as the interlayer dielectric layers 22. For example, the dielectric layer 30 may be formed of silicon oxide.

The horizontal portion LP may be an etch end target of any one of a plurality of slimming holes SH, which are etched simultaneously in a Z-slim process. A slimming hole SH, which has the horizontal portion LP as an etch end target, may be defined as a slimming hole SH for monitoring. FIG. 4 illustrates a slimming hole SH used for monitoring.

The sidewall of the trench TE may be optically detected on the bottom surface of the slimming hole SH, and the horizontal portion LP may be detected on the basis of the detected position of the sidewall of the trench TE. A method for detecting the horizontal portion LP will be described later with reference to FIGS. 5 to 7D.

Figure 5:
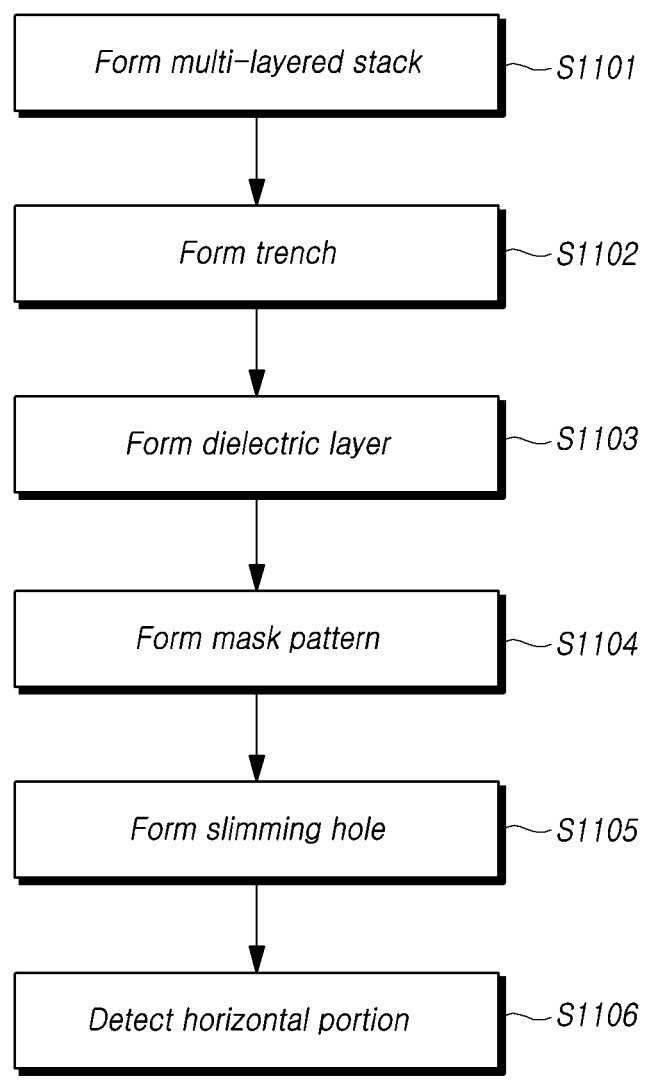
FIG. 5 is a flowchart illustrating a method for manufacturing a memory device in accordance with an embodiment of the disclosure.

FIG. 5 is a flowchart illustrating a method for manufacturing a memory device in accordance with an embodiment of the disclosure, and FIGS. 6A to 6D are cross-sectional views illustrating, according to a manufacturing process sequence, a memory device in accordance with an embodiment of the disclosure. FIGS. 7A to 7D are top views, corresponding to FIGS. 6A to 6D, that illustrate a manufacturing process sequence for a memory device in accordance with an embodiment of the disclosure and.

Referring to FIGS. 5 to 7D, a method for manufacturing a memory device may include forming a multi-layered stack ML by alternately stacking a plurality of first material layers 24 and a plurality of second material layers 22 on a substrate 10 (S1101); forming, in the multi-layered stack ML, a trench TE having an upper sidewall SWa, a lower sidewall SWb and a horizontal portion LP that couples the upper sidewall SWa and the lower sidewall SWb and that is parallel to a top surface of the substrate 10 (S1102); filling the trench TE with a dielectric layer 30 (S1103); forming, on the multi-layered stack ML and the dielectric layer 30, a mask pattern PR having an opening that exposes a region including a sidewall of the trench TE (S1104); forming a slimming hole SH by etching the multi-layered stack ML and the dielectric layer 30 by using the mask pattern PR as an etch mask (S1105); and detecting the horizontal portion LP (S1106).

The method for manufacturing a memory device in accordance with an embodiment of the disclosed technology will be described below in more detail.

Figure 6A:
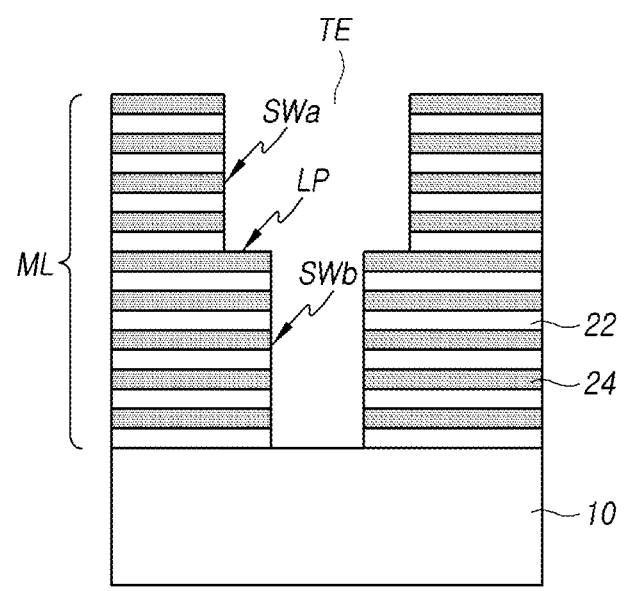
FIGS. 6A to 6D are cross-sectional views illustrating, by manufacturing process sequence, a memory device in accordance with an embodiment of the disclosure.
Figure 6A:
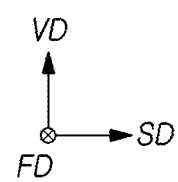
Figure 7A:
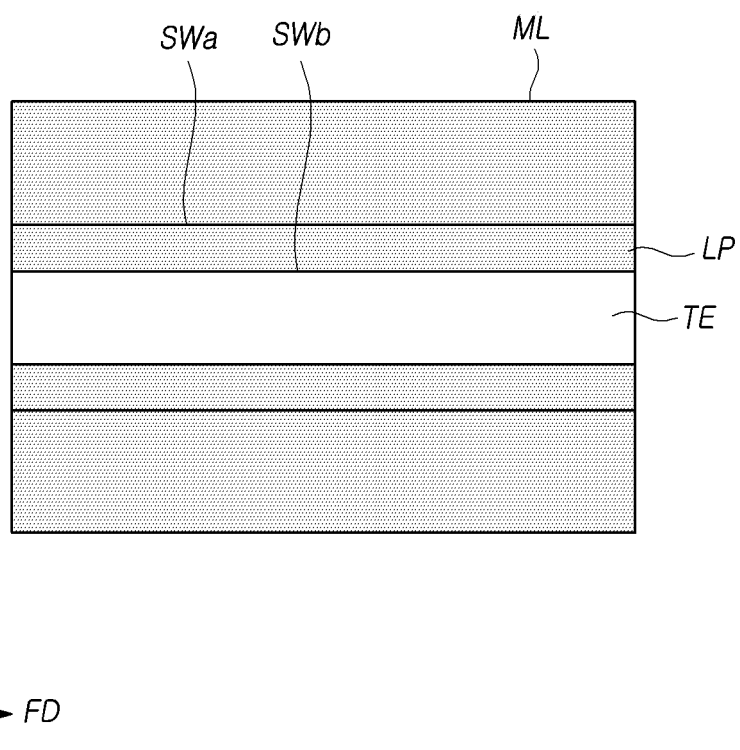
FIGS. 7A to 7D are top views illustrating, by manufacturing process sequence, a memory device in accordance with an embodiment of the disclosure.

Referring to FIGS. 6A and 7A, the multi-layered stack ML is formed by alternately stacking the plurality of first material layers 24 and the plurality of second material layers 22 on the substrate 10.

In an embodiment, the first material layers 24 may include sacrificial layers, and the second material layers 22 may include interlayer dielectric layers. The first material layers 24 may be formed of a dielectric material that has a different etching selectivity from the second material layers 22. For example, the second material layers 22 may be formed of silicon oxide, and the first material layers 24 may be formed of silicon nitride.

The trench TE may include the upper sidewall SWa, the lower sidewall SWb, and the horizontal portion LP that couples the upper sidewall SWa and the lower sidewall SWb. The horizontal portion LP may be substantially parallel to the top surface of the substrate 10. The upper sidewall SWa and the lower sidewall SWb are separated from each other in a horizontal direction, with the horizontal portion LP interposed therebetween.

Figure 6B:
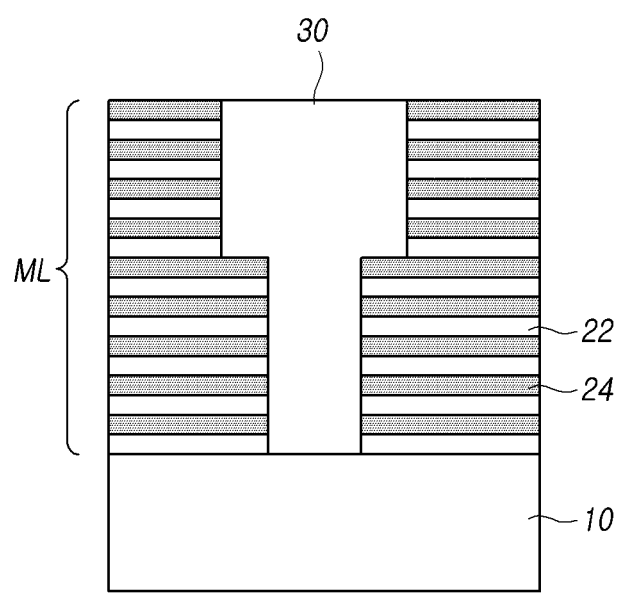
Figure 6B:
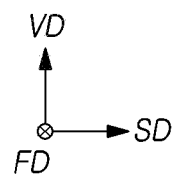
Figure 7B:
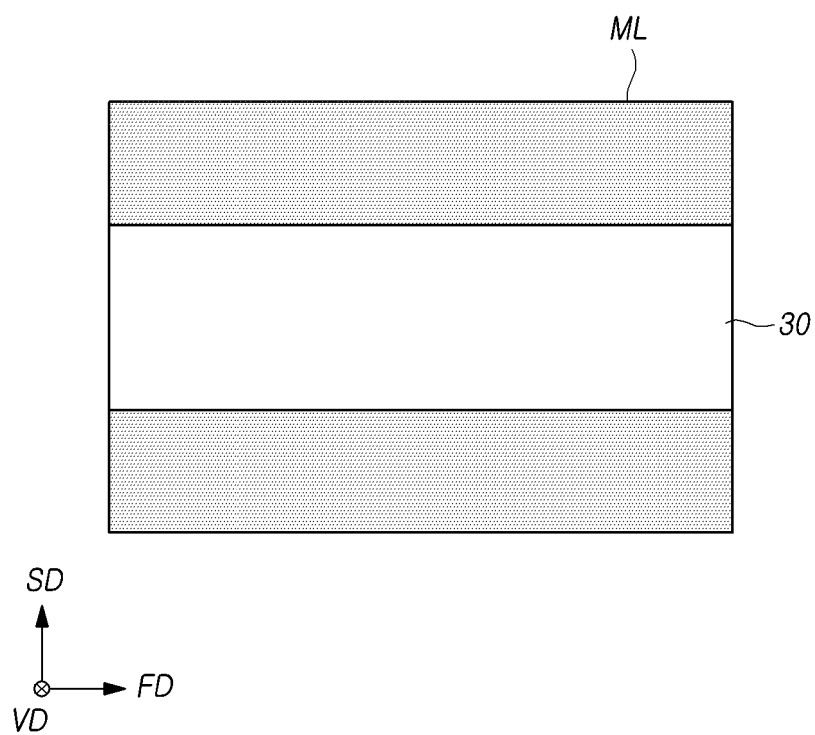

Referring to FIGS. 6B and 7B, the dielectric layer 30 is formed in the trench TE. The dielectric layer 30 may be formed by applying a dielectric material to the entire structure including the trench TE to fill the trench TE, and then removing the dielectric material formed outside the trench TE.

For example, the dielectric layer 30 may be formed of the same material as the second material layers 22. For example, the second material layers 22 and the dielectric layer 30 may be formed of silicon oxide.

Referring to FIGS. 6C, 7C, 6D and 7D, the mask pattern PR having an opening that exposes a region including a sidewall of the trench TE is formed on the dielectric layer 30 and the multi-layered stack ML, and the slimming hole SH is formed by etching the multi-layered stack ML and the dielectric layer 30 by a Z-slim process using the mask pattern PR as an etch mask.

Figure 6C:
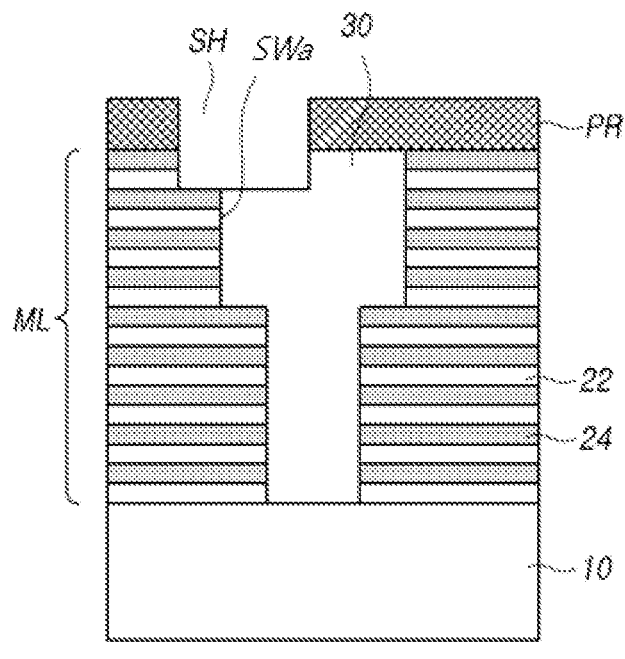
Figure 6C:
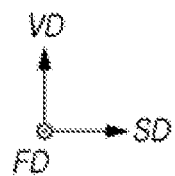
Figure 6D:
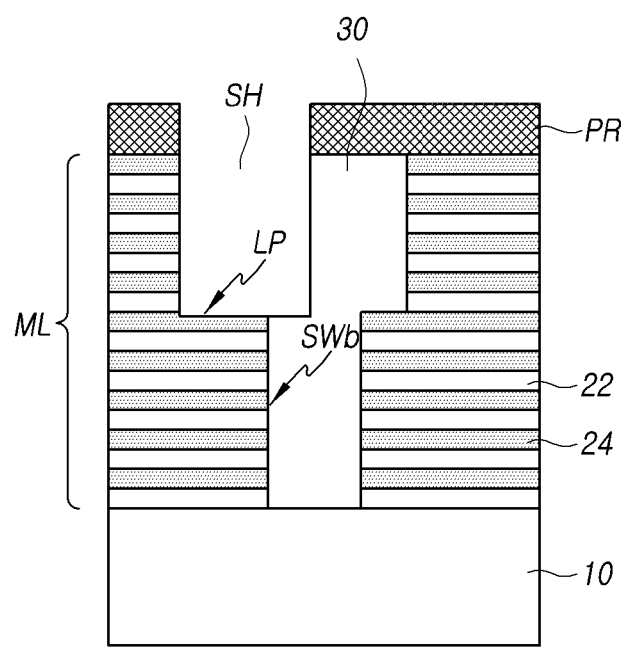
Figure 7C:
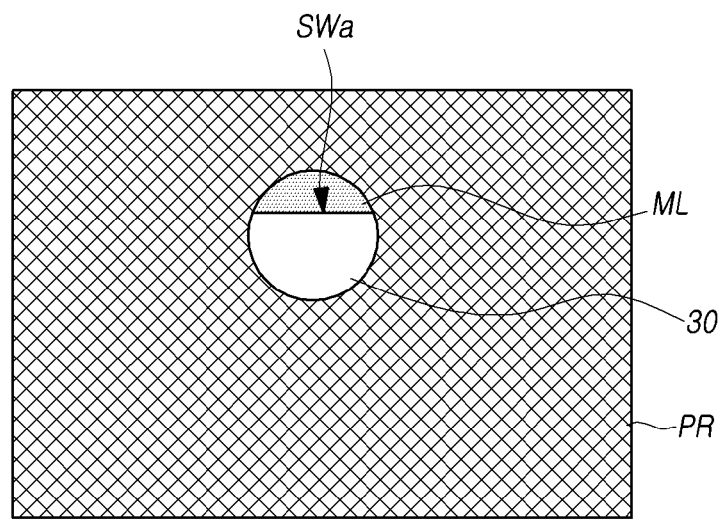
Figure 7C:
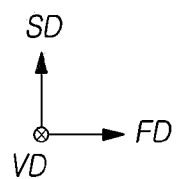
Figure 7D:
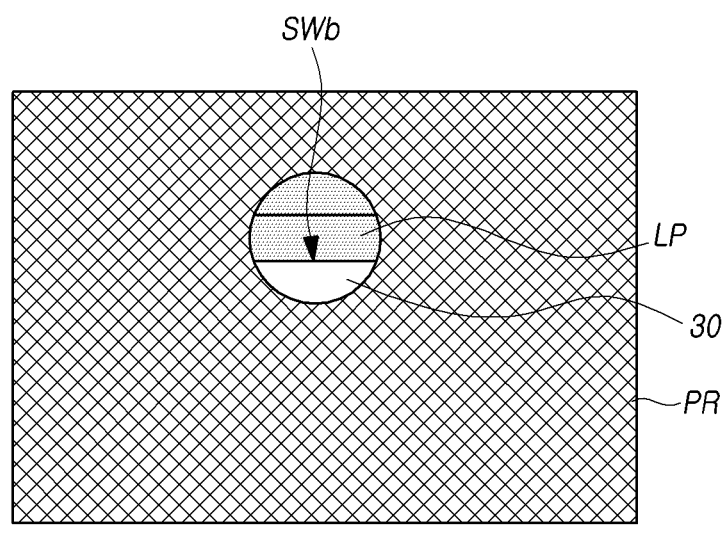
Figure 7D:
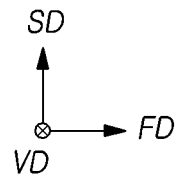

Optically, the position of the sidewall of the trench TE may be detected on the bottom surface of the slimming hole SH. The detected position of the sidewall of the trench TE is different before the horizontal portion LP is exposed compared to after the horizontal portion LP is exposed. As illustrated in FIGS. 6C and 7C, before the horizontal portion LP is exposed, the upper sidewall SWa of the trench TE may be detected on the bottom surface of the slimming hole SH. On the other hand, as illustrated in FIGS. 6D and 7D, after the horizontal portion LP is exposed, the lower sidewall SWb of the trench TE may be detected on the bottom surface of the slimming hole SH.

The horizontal portion LP may be detected at the same time the lower sidewall SWb starts to be detected. Thus, detecting the horizontal portion LP may be considered as checking a time point at which the lower sidewall SWb starts to be detected on the bottom surface of the slimming hole SH.

As described above, the upper sidewall SWa and the lower sidewall SWb are separated from each other in the horizontal direction with the horizontal portion LP interposed between. Therefore, before and after a time point at which the horizontal portion LP is exposed, the position of the sidewall of the trench TE detected on the bottom surface of the slimming hole SH may change, and the change may be discontinuous with respect to horizontal position. When the position of the sidewall of the trench TE detected on the bottom surface of the slimming hole SH changes by the distance between the upper sidewall SWa and the lower sidewall SWb, then the horizontal portion LP is detected. Thus, detecting the horizontal portion LP also checks for the point in time at which the position of the sidewall of the trench TE detected on the bottom surface of the slimming hole SH discontinuously changes by the distance between the upper sidewall SWa and the lower sidewall SWb.

When the horizontal portion LP is detected, the Z-slim process may be ended. In other words, the detection time point of the horizontal portion LP may be used as an etch end point. Accordingly, the bottom surface of the slimming hole SH may be disposed on the first material layer 24 on which the horizontal portion LP is positioned. Thereafter, although not illustrated, electrode layers (see 20 of FIG. 4) may be formed by replacing the first material layers 24 with an electrode material.

Figure 8:
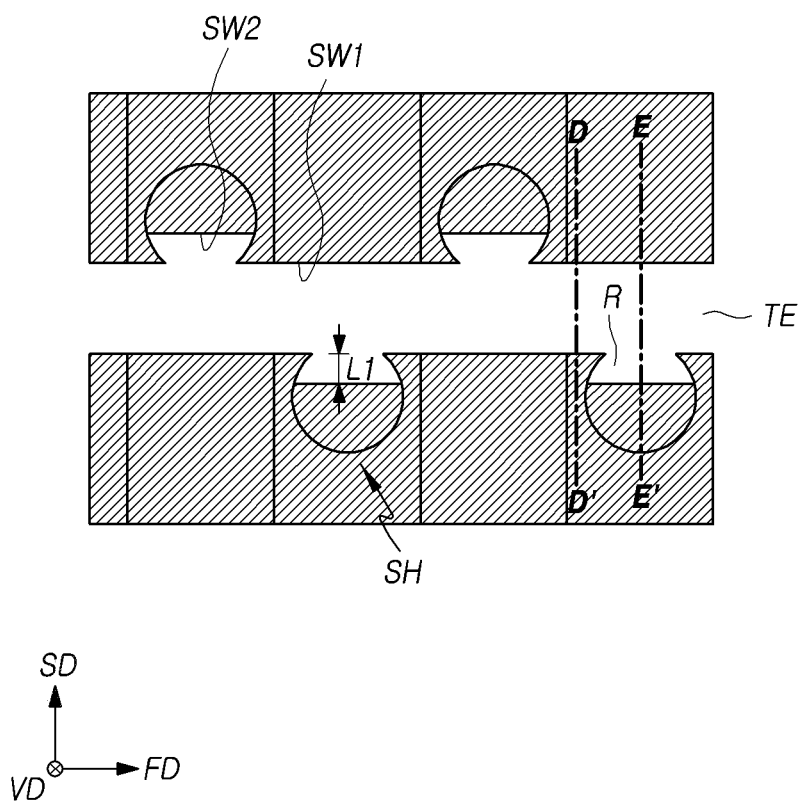
FIG. 8 is a top view illustrating a memory device in accordance with another embodiment of the disclosure.
Figure 9:
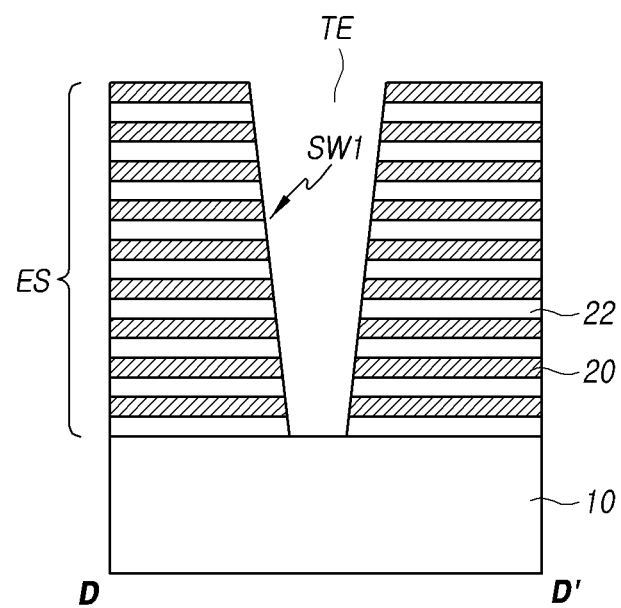
FIG. 9 is a cross-sectional view taken along a line D-D' of FIG. 8.
Figure 9:
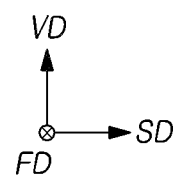
Figure 10:
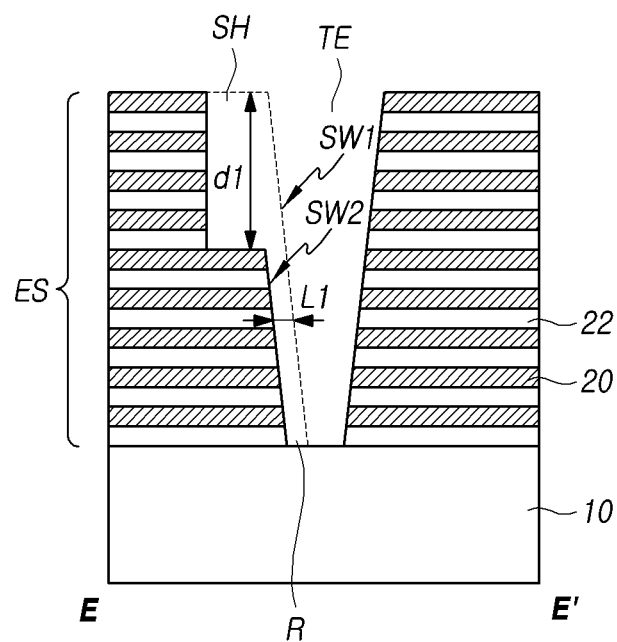
FIG. 10 is a cross-sectional view taken along a line E-E' of FIG. 8.

FIG. 8 is a top view illustrating a memory device in accordance with another embodiment of the disclosure, FIG. 9 is a cross-sectional view taken along a line D-D' of FIG. 8, and FIG. 10 is a cross-sectional view taken along a line E-E' of FIG. 8.

Referring to FIGS. 8 to 10, a memory device may include an electrode structure ES including a plurality of electrode layers 20 and a plurality of interlayer dielectric layers 22, which are alternately stacked on a substrate 10; a trench TE formed in the electrode structure ES and having an inclined sidewall SW1; a slimming hole SH formed in a region of the electrode structure ES including the sidewall SW1 of the trench TE; and a recess R formed on the sidewall SW1 of the trench TE under the slimming hole SH.

The plurality of electrode layers 20 may have the same thickness as each other. The plurality of interlayer dielectric layers 22 may have the same thickness as each other. The vertical pitch of the plurality of electrode layers 20 may be constant. The vertical pitch of the electrode layers 20 means the distance between the top surfaces of two adjacent electrode layers 20.

The trench TE may pass through the electrode structure ES in the vertical direction VD. Although FIGS. 8 to 10 illustrate a trench TE completely passing through the electrode structure ES, the disclosed technology is not limited thereto. The trench TE may partially pass through the electrode structure ES.

The sidewall SW1 may be linear and inclined with respect to the top surface of the substrate 10. In the present specification, 'linear sidewall' may refer to a sidewall having a constant inclination. The sidewall SW1 of the trench TE may have an inclination between 0 degrees and 90 degrees with respect to the top surface of the substrate 10.

As will be described below with reference to FIGS. 11 to 12C, the slimming hole SH is formed using a Z-slim process. The recess R is formed as the sidewall SW1 of the trench TE under the slimming hole SH is etched in the Z-slim process. The etching process may result in a sidewall SW2 of the recess R that is parallel to the sidewall SW1 of the trench TE and has substantially the same inclination as the sidewall SW1 of the trench TE.

A depth d1 of the slimming hole SH may have a size proportional to a distance L1, measured in the horizontal direction, between the sidewall SW1 of the trench TE and the sidewall SW2 of the recess R. In detail, d1 may have a size corresponding to k1 times L1. Here, k1 is a proportionality constant that is calculated using experimental data.

Figure 11:
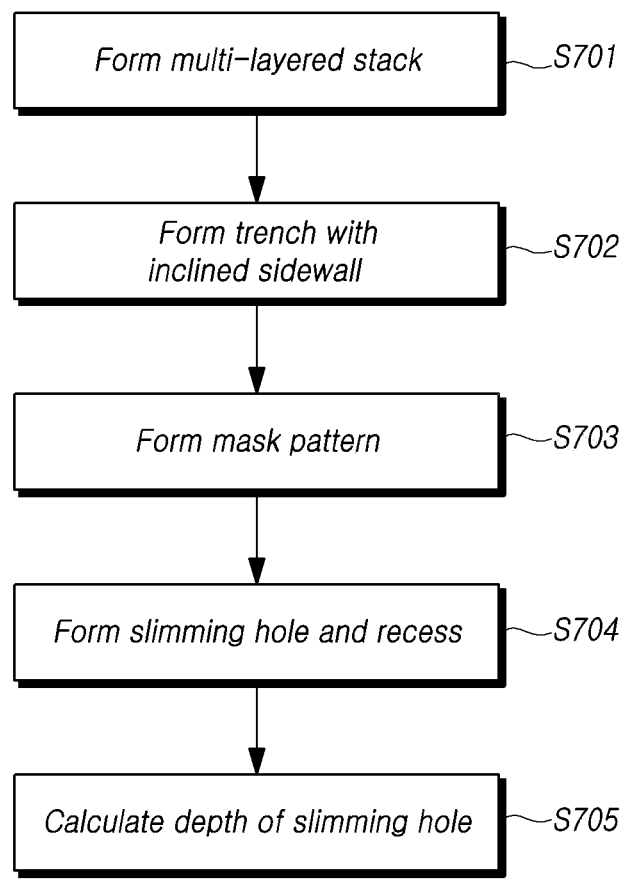
FIG. 11 is a flowchart illustrating a method for manufacturing a memory device in accordance with another embodiment of the disclosure.
Figure 12A:
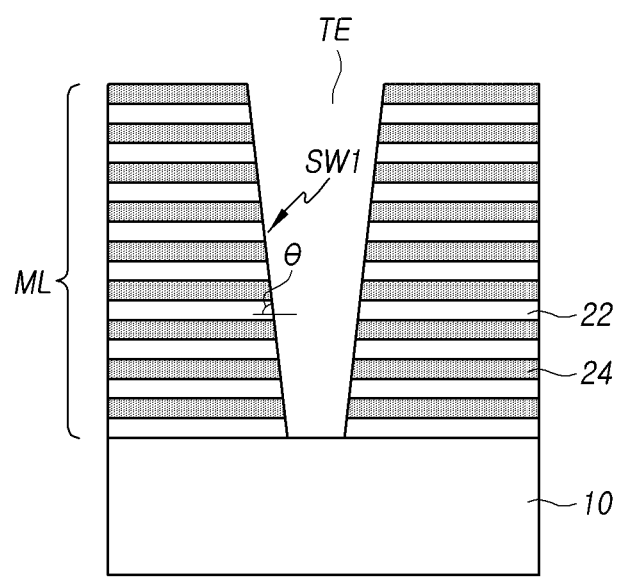
FIGS. 12A to 12C are cross-sectional views illustrating, by manufacturing process sequence, a memory device in accordance with an embodiment of the disclosure.
Figure 12B:
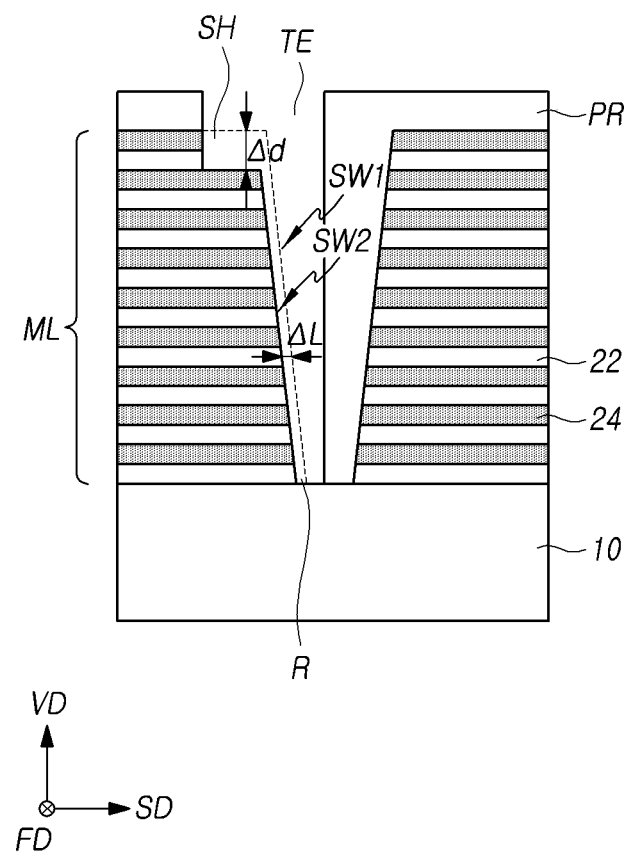
Figure 12C:
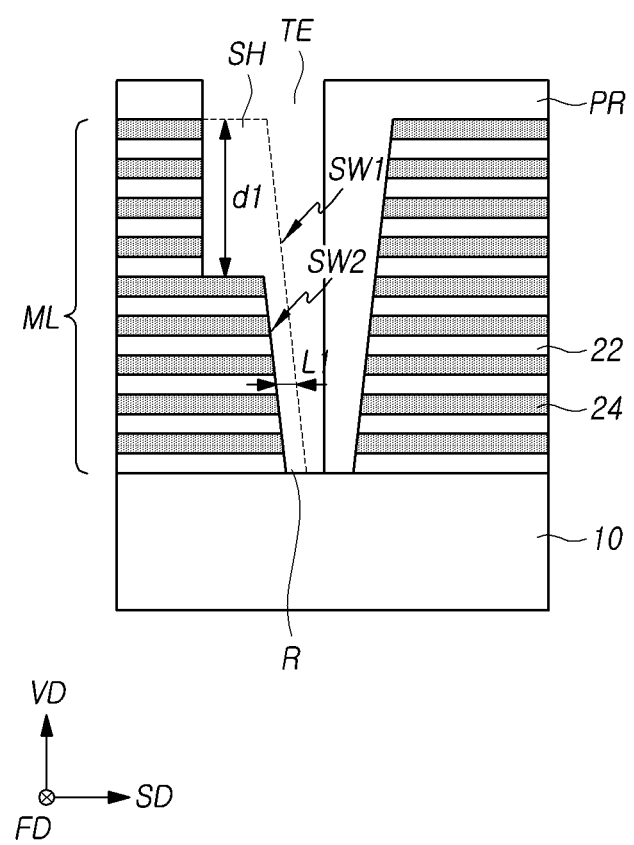

FIG. 11 is a flowchart illustrating a method for manufacturing a memory device in accordance with another embodiment of the disclosure, and FIGS. 12A to 12C are cross-sectional views illustrating, according to a manufacturing process sequence, a memory device in accordance with an embodiment of the disclosure.

Referring to FIGS. 11 to 12C, a method for manufacturing a memory device in accordance with another embodiment may include forming a multi-layered stack ML by alternately stacking a plurality of first material layers 24 and a plurality of second material layers 22 on a substrate 10 (S701); forming, in the multi-layered stack ML, a trench TE having an inclined sidewall SW1 (S702); forming, on the multi-layered stack ML, a mask pattern PR having an opening that exposes a region including a sidewall SW1 of the trench TE (S703); forming a slimming hole SH by etching the multi-layered stack ML using the mask pattern PR as an etch mask and forming a recess R on a sidewall SW1 of the trench TE under the slimming hole SH (S704); and calculating the depth of the slimming hole SH on the basis of the horizontal distance between the sidewall SW1 of the trench TE and a sidewall SW2 of the recess R (S705).

The method for manufacturing a memory device in accordance with this embodiment of the disclosure will be described below in more detail.

Referring to FIG. 12A, the multi-layered stack ML is formed by alternately stacking a plurality of first material layers 24 and a plurality of second material layers 22 on the substrate 10.

In an embodiment, the first material layers 24 may include sacrificial layers, and the second material layers 22 may include interlayer dielectric layers. The first material layers 24 may be formed of a dielectric material that has a different etching selectivity from the second material layers 22. For example, the second material layers 22 may be formed of silicon oxide, and the first material layers 24 may be formed of silicon nitride.

The plurality of first material layers 24 may have the same thickness as each other. The plurality of second material layers 22 may have the same thickness as each other. The vertical pitch of the plurality of first material layers 24 may be constant. The vertical pitch of the first material layers 24 means the distance between the top surfaces of two adjacent first material layers 24.

The trench TE is formed in the multi-layered stack ML. The trench TE has the linear sidewall SW1 that is inclined with respect to the top surface of the substrate 10. The sidewall SW1 of the trench TE has a constant inclination θ with respect to the top surface of the substrate 10.

Referring to FIGS. 12B and 12C, the mask pattern PR, which exposes a region of the multi-layered stack ML including the sidewall SW1 of the trench TE, is formed on the multi-layered stack ML. The slimming hole SH is formed by etching the multi-layered stack ML through a Z-slim process using the mask pattern PR as an etch mask.

In addition to forming the slimming hole SH, the Z-slim process also forms the recess R under the slimming hole SH. The recess R forms as the sidewall SW1 of the trench TE under the slimming hole SH, exposed by the mask pattern PR, is etched. As illustrated in FIG. 12B, while one first material layer 24 and one second material layer 22 are etched, that is, while the multi-layered stack ML is etched by a thickness of Δd, the side wall SW2 of the recess R may move horizontally by ΔL from the sidewall SW1 of the trench TE.

If the etching thickness of the Z-slim process increases, then the depth of the slimming hole SH increases and the distance by which the sidewall SW2 of the recess R moves increases. The distance by which the sidewall SW2 of the recess R moves may correspond to the distance between the sidewall SW1 of the trench TE and the sidewall SW2 of the recess R. Therefore, if the depth of the slimming hole SH increases, then the horizontal distance between the sidewall SW1 of the trench TE and the sidewall SW2 of the recess R increases.

The positions of the lower end of the sidewall SW1 of the trench TE and the lower end of the sidewall SW2 of the recess R may be optically detected during the Z-slim process. Also, by using these positions, a horizontal distance L1 between the sidewall SW1 of the trench TE and the sidewall SW2 of the recess R may be measured.

A depth d1 of the slimming hole SH is proportional to the horizontal distance L1 between the sidewall SW1 of the trench TE and the sidewall SW2 of the recess R. Through data obtained from a number of experiments, the precise proportional relationship between d1 and L1 may be known. For example, a proportional relationship expression of d1=L1×k1 may be obtained, where k1 is a constant. Therefore, by measuring L1, d1 may be calculated.

The end point of the Z-slim process may be determined on the basis of d1 calculated using the proportional expression. When d1 calculated using the proportional expression is equal to the target depth of the slimming hole SH, the Z-slim process may be ended.

Thereafter, although not illustrated, by forming slits (see SLT of FIG. 1) in a cell region, removing the first material layers 24 by injecting an etchant capable of removing the first material layers 24 through the slits and trenches TE, and then filling an electrode material into spaces from which the first material layers 24 are removed, electrode layers (see 20 of FIG. 10) may be formed.

Figure 13A:
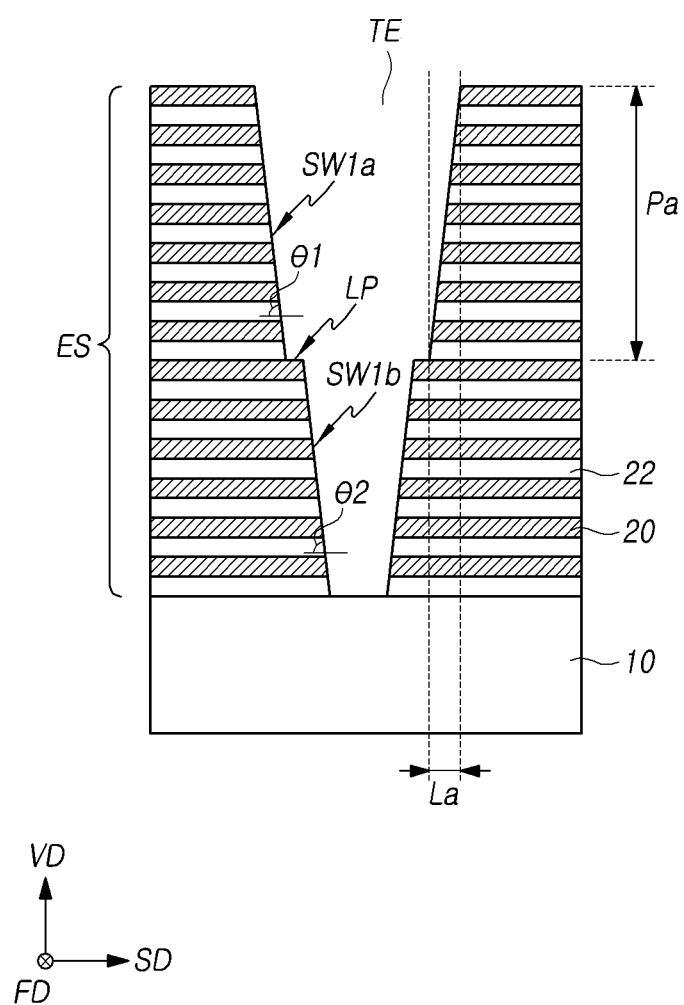
FIGS. 13A to 13C are cross-sectional views illustrating a memory device in accordance with other embodiments of the disclosure.
Figure 13B:
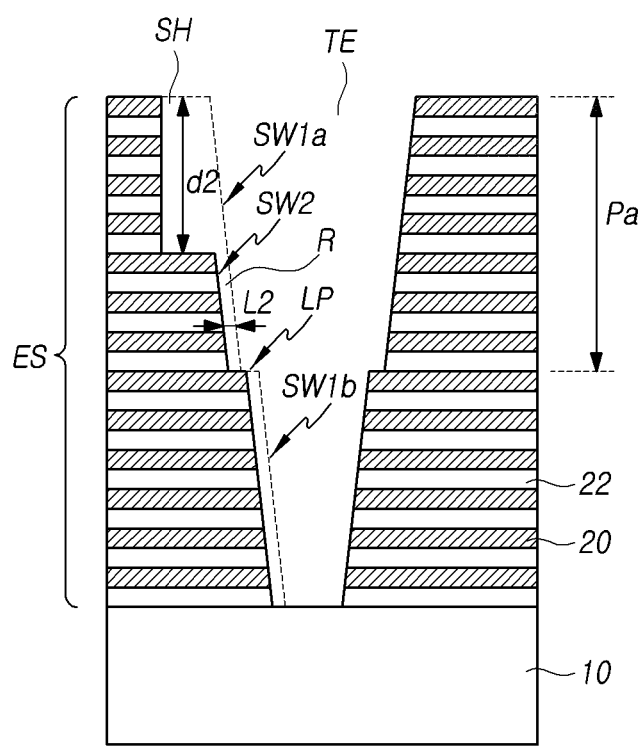

FIGS. 13A to 13B are cross-sectional views illustrating a memory device in accordance with other embodiments of the disclosure.

Referring to FIG. 13A, a sidewall of a trench TE of a memory device may include an upper sidewall SW1a that has a first inclination θ1 with respect to the top surface of a substrate 10, a lower sidewall SW1b that has a second inclination θ2 with respect to the top surface of the substrate 10, and a horizontal portion LP that couples the upper sidewall SW1a and the lower sidewall SW1b, and that is parallel to the top surface of the substrate 10.

If a stack number of electrode layers 20 and interlayer dielectric layers 22 increases, then the depth of the trench TE will increase. Where a deep trench is formed through one etching process, the non-uniformity of the etching process may increase, and thus, the error of a proportional expression may increase.

Figure 13C:
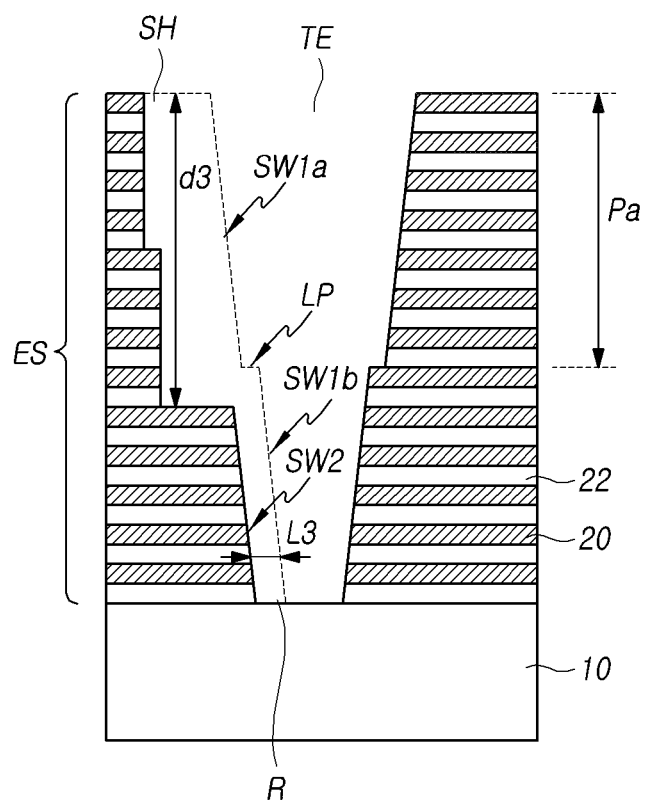

In order to reduce an error due to an increase in etching depth, the trench TE may be formed using two or more etching processes. FIGS. 13A to 13C illustrate a trench TE formed through two etching processes.

After forming a preliminary trench through a primary etching process, the trench TE may be formed by forming a mask pattern having an opening that exposes the preliminary trench and performing a secondary etching process using the mask pattern as an etch mask. When forming the mask pattern used in the secondary etching process, in order to overlay the preliminary trench, the opening of the mask pattern may be formed to be larger than the inlet of the preliminary trench (not illustrated). Due to the difference between the area of the opening of the mask pattern and the area of the inlet of the preliminary trench, the horizontal portion LP may be formed between the upper sidewall SW1a and the lower sidewall SW1b of the trench TE.

As described above, the upper sidewall SW1a of the trench TE may have the inclination of θ1 with respect to the top surface of the substrate 10. The lower sidewall SW1b of the trench TE may have the inclination of θ2 with respect to the top surface of the substrate 10. Angles θ1 and θ2 may have different values. In other embodiments, angles θ1 and θ2 may have the same value.

The positions of the upper end of the upper sidewall SW1a and the lower end of the upper sidewall SW1a may be optically detected. In addition, by using these positions, a horizontal distance La between the upper end of the upper side wall SW1a and the lower end of the upper side wall SW1a may be measured.

The horizontal distance La between the upper end of the upper sidewall SW1a of the trench TE and the lower end of the upper sidewall SW1a of the trench TE is proportional to a vertical distance Pa between the top surface of the electrode structure ES and the horizontal portion LP. Through data obtained from a number of experiments, the precise proportional relationship between La and Pa may be known. For example, a proportional relationship expression of Pa=La×ka may be obtained, where ka is a constant. Therefore, by measuring La, Pa may be calculated.

Referring to FIG. 13B, in an embodiment, the target depth of the slimming hole SH may be smaller than Pa. A depth d2 of the slimming hole SH is proportional to a horizontal distance L2 between the upper sidewall SW1a of the trench TE and a sidewall SW2 of a recess R. Through data obtained from a number of experiments, the precise proportional relationship between d2 and L2 may be known. For example, a proportional relationship expression of d2=L2×k2 may be obtained, where k2 is a constant. Therefore, by measuring L2, d2 may be calculated.

Referring to FIG. 13C, in another embodiment, the target depth of the slimming hole SH may be larger than Pa. A depth d3 of the slimming hole SH is proportional to a horizontal distance L3 between the lower sidewall SW1b of the trench TE and a sidewall SW2 of a recess R. Through data obtained from a number of experiments, the precise proportional relationship between d3 and L3 may be known. For example, a proportional relationship expression of d3=L3×k3 may be obtained, where k3 is a constant. Therefore, by measuring L3, d3 may be calculated.

Figure 14:
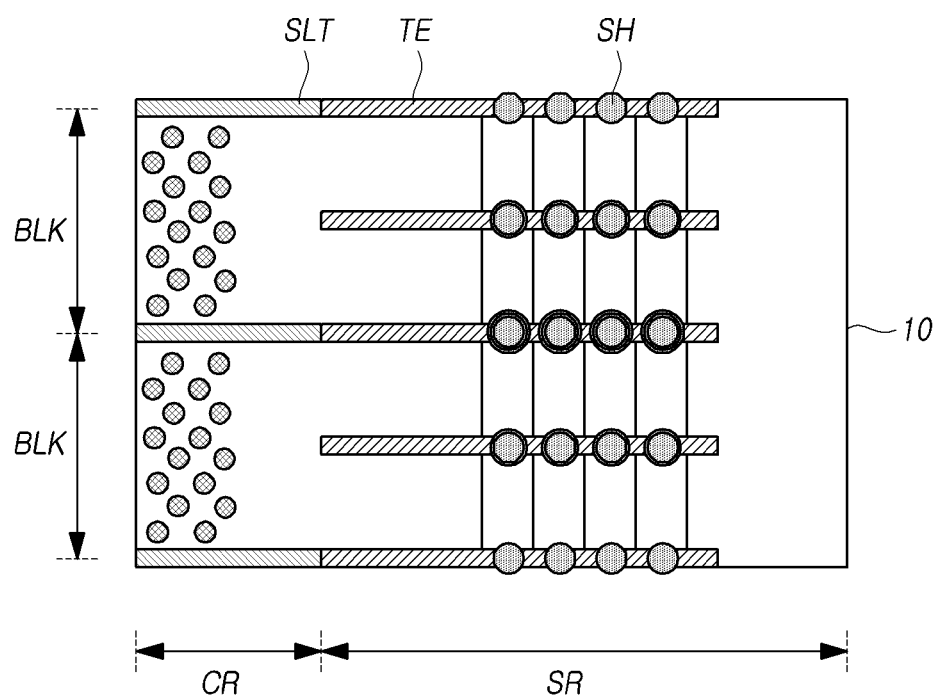
FIGS. 14 and 15 are top views illustrating memory devices in accordance with embodiments of the disclosure.
Figure 14:
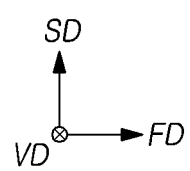
Figure 15:
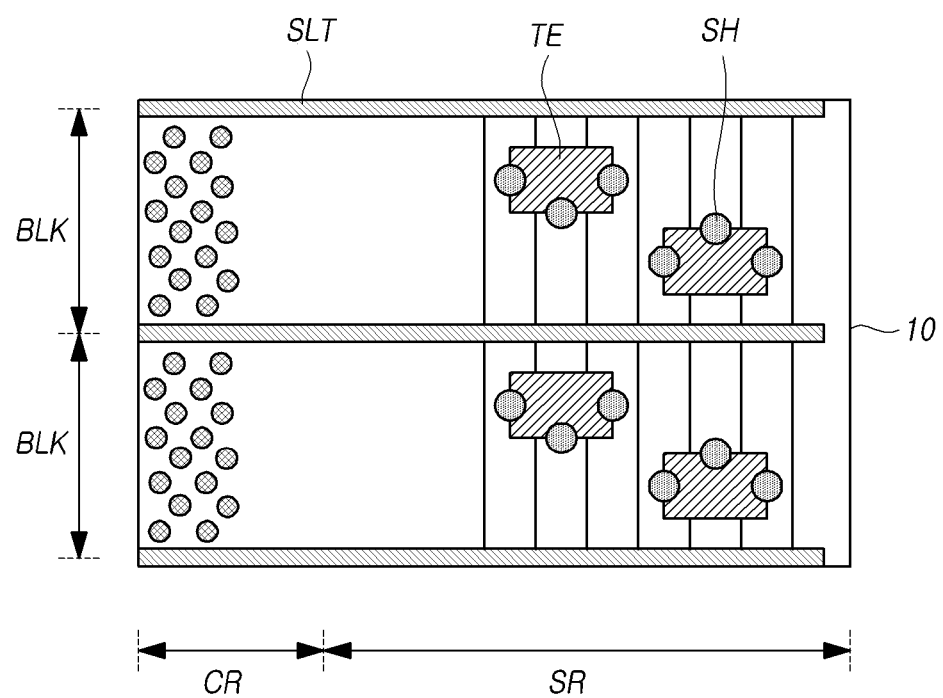

FIGS. 14 and 15 are top views illustrating memory devices in accordance with embodiments of the disclosure.

In an embodiment described above with reference to FIG. 1, the slimming hole SH is configured to pass through one sidewall of a corresponding trench TE, but the disclosed technology is not limited thereto.

As illustrated in FIG. 14, a slimming hole SH may be configured to pass through both sidewalls of a corresponding trench TE. In this case, the slimming hole SH may expose the pad regions of electrode layers of two memory blocks BLK, which are positioned on both sides of the corresponding trench TE.

In the embodiments described above with reference to FIGS. 1 and 14, a plurality of slits SLT are formed in the form of lines traversing the cell region CR of the electrode structure ES, the plurality of trenches TE are formed in the form of lines traversing the slimming region SR of the electrode structure ES, and the electrode structure ES is divided into units of memory blocks BLK by the plurality of slits SLT and the plurality of trenches TE, but the disclosed technology is not limited thereto.

For example, as illustrated in FIG. 15, a plurality of slits SLT may be configured to traverse a cell region CR and a slimming region SR of an electrode structure ES such that the electrode structure ES is divided into units of memory blocks BLK by the plurality of slits SLT, and trenches TE and slimming holes SH may be configured between two adjacent slits SLT. Although the embodiment of FIG. 15 illustrates a case where the trench TE has a rectangular cross-sectional planar structure, the disclosed technology is not limited thereto. The trench TE may have a cross-sectional planar structure of various shapes such as a polygonal shape, an elliptical shape, a circular shape and a linear shape.

Figure 16:
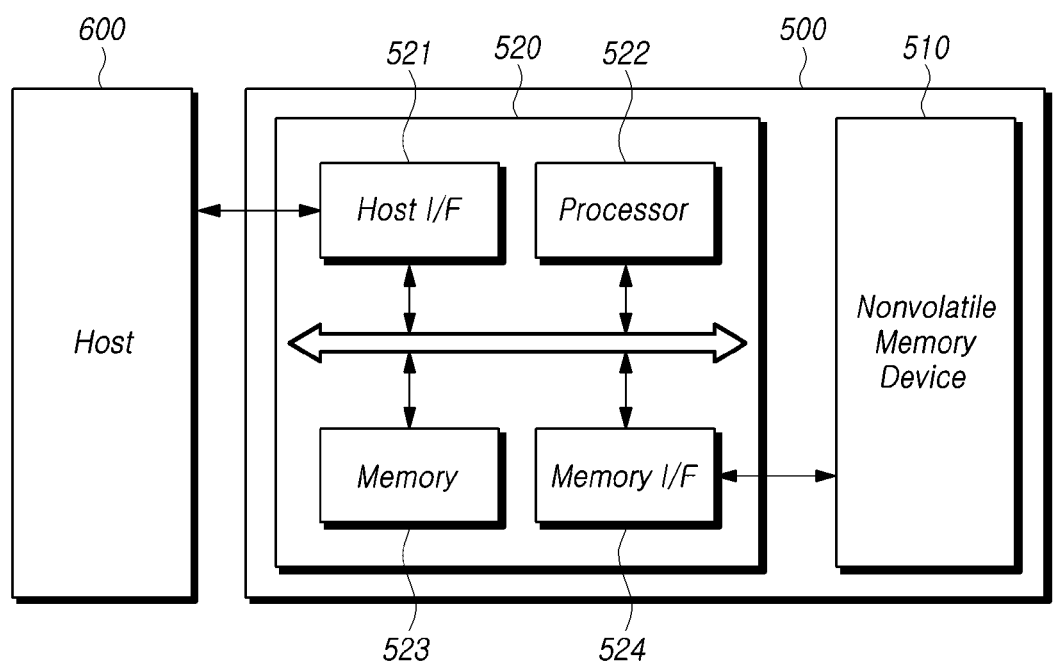
FIG. 16 is a block diagram schematically illustrating a memory system including a memory device in accordance with an embodiment of the disclosure.

FIG. 16 is a block diagram schematically illustrating a memory system including a memory device in accordance with an embodiment of the disclosure.

Referring to FIG. 16, a memory system 500 may store data to be accessed by a host 600 such as a mobile phone, an MP3 player, a laptop computer, a desktop computer, a game player, a TV, an in-vehicle infotainment system, and so forth.

The memory system 500 may be manufactured as any one of various kinds of storage devices according to the protocol of an interface which is electrically coupled to the host 600. For example, the memory system 500 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 500 may be manufactured as any one among various kinds of package types. For example, the memory system 500 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 500 may include a nonvolatile memory device 510 and a controller 520.

The nonvolatile memory device 510 may operate as a storage medium of the memory system 500. The nonvolatile memory device 510 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound, depending on the type of memory cells.

While FIG. 16 illustrates that the memory system 500 includes one nonvolatile memory device 510, this is only for the sake of convenience in explanation, and the memory system 500 may include a plurality of nonvolatile memory devices. The disclosed technology may be applied the same to the memory system 500 including a plurality of nonvolatile memory devices. The nonvolatile memory device 510 may include the memory device based on the embodiment of the disclosed technology.

The controller 520 may control general operations of the memory system 500 through driving of firmware or software loaded in a memory 523. The controller 520 may decode and drive a code type instruction or algorithm such as firmware or software. The controller 520 may be implemented in the form of hardware or in a combined form of hardware and software.

The controller 520 may include a host interface 521, a processor 522, the memory 523 and a memory interface 524. Although not illustrated in FIG. 16, the controller 520 may further include an ECC (error correction code) engine which generates a parity by ECC-encoding write data provided from the host 600 and ECC-decodes read data, read from the nonvolatile memory device 510, by using the parity.

The host interface 521 may interface the host 600 and the memory system 500 in correspondence to the protocol of the host 600. For example, the host interface 521 may communicate with the host 600 through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 522 may be configured by a micro control unit (MCU) or a central processing unit (CPU). The processor 522 may process a request transmitted from the host 600. In order to process a request transmitted from the host 600, the processor 522 may drive a code type instruction or algorithm, that is, firmware, loaded in the memory 523, and may control the internal function blocks such as the host interface 521, the memory 523 and the memory interface 524 and the nonvolatile memory device 510.

The processor 522 may generate control signals for controlling the operation of the nonvolatile memory device 510, on the basis of requests transmitted from the host 600, and may provide the generated control signals to the nonvolatile memory device 510 through the memory interface 524.

The memory 523 may be configured by a random access memory such as a dynamic random access memory (DRAM) or a static random access memory (SRAM). The memory 523 may store firmware to be driven by the processor 522. Also, the memory 523 may store data necessary for driving the firmware, for example, metadata. Namely, the memory 523 may operate as a working memory of the processor 522.

The memory 523 may be configured to include a data buffer for temporarily storing write data to be transmitted from the host 600 to the nonvolatile memory device 510 or read data to be transmitted from the nonvolatile memory device 510 to the host 600. In other words, the memory 523 may operate as a buffer memory. The memory 523 may receive and store map data from the nonvolatile memory device 510 when the memory system 500 is booted.

The memory interface 524 may control the nonvolatile memory device 510 under the control of the processor 522. The memory interface 524 may also be referred to as a memory controller. The memory interface 524 may provide control signals to the nonvolatile memory device 510. The control signals may include a command, an address, an operation control signal and so forth for controlling the nonvolatile memory device 510. The memory interface 524 may provide data, stored in the data buffer, to the nonvolatile memory device 510, or may store data, transmitted from the nonvolatile memory device 510, in the data buffer.

The controller 520 may further include a map cache (not illustrated) which caches map data referred to by the processor 522 among map data stored in the memory 523.

Figure 17:
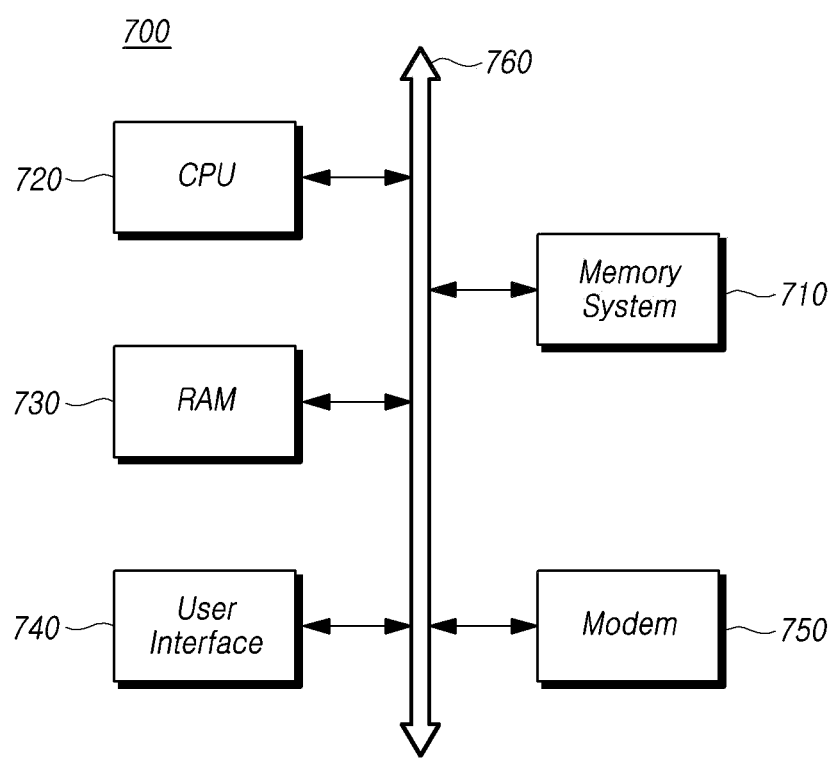
FIG. 17 is a block diagram schematically illustrating a computing system including a memory device in accordance with an embodiment of the disclosure.

FIG. 17 is a block diagram schematically illustrating a computing system including a memory device in accordance with an embodiment of the disclosure.

Referring to FIG. 17, a computing system 700 in accordance with an embodiment may include a memory system 710, a microprocessor 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to those skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

The above-described exemplary embodiment of the disclosure may be implemented not only through an apparatus and method but also through a program that realizes a function corresponding to a configuration of the exemplary embodiment of the disclosure or through a recording medium on which the program is recorded, and can be easily implemented by a person of ordinary skill in the art from the description of the foregoing exemplary embodiment.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A memory device comprising:
   an electrode structure including a plurality of electrode layers and a plurality of interlayer dielectric layers that are alternately stacked on a substrate;
   a trench in the electrode structure, and having an upper sidewall, a lower sidewall and a horizontal portion that couples the upper sidewall to the lower sidewall and that is parallel to a top surface of the substrate;
   a dielectric layer in the trench; and
   a slimming hole in the electrode structure having a sidewall of the trench and a sidewall of the dielectric layer, and having a bottom surface disposed on an electrode layer on which the horizontal portion of the trench is positioned.

2. The memory device according to claim 1, further comprising:
   a plurality of slits passing through a cell region of the electrode structure, and extending in a first direction parallel to the top surface of the substrate,
   wherein the trench is disposed in a slimming region of the electrode structure, which is adjacent to the cell region of the electrode structure in the first direction.

3. The memory device according to claim 2, wherein the trench is configured to be disposed on the same line as one of the plurality of slits to divide the electrode structure.

4. The memory device according to claim 2, wherein a sidewall of the slimming hole is common to one of both sidewalls of the trench that face each other in a second direction parallel to the top surface of the substrate and intersecting with the first direction.

5. The memory device according to claim 2, wherein the slimming hole includes both sidewalls of the trench that face each other in a second direction parallel to the top surface of the substrate and intersecting with the first direction.

6. The memory device according to claim 1, further comprising:
   a plurality of slits passing through a cell region and a slimming region of the electrode structure, and extending in a first direction parallel to the top surface of the substrate to divide the electrode structure,
   wherein the trench and the slimming hole are configured between two adjacent slits in the slimming region.

7. A memory device comprising:
   an electrode structure including a plurality of electrode layers and a plurality of interlayer dielectric layers that are alternately stacked on a substrate;
   a trench formed in the electrode structure, and having an inclined sidewall;
   a slimming hole formed in a region of the electrode structure including the sidewall of the trench; and
   a recess formed on the sidewall of the trench under the slimming hole.

8. The memory device according to claim 7, further comprising:
   a plurality of slits passing through a cell region of the electrode structure, and extending in a first direction parallel to a top surface of the substrate,
   wherein the trench is formed in a slimming region of the electrode structure, which is adjacent to the cell region of the electrode structure in the first direction.

9. The memory device according to claim 8, wherein the trench is configured to be disposed on the same line as one of the plurality of slits to divide the electrode structure.

10. The memory device according to claim 8, wherein the slimming hole is configured to pass through one of both sidewalls of the trench that face each other in a second direction parallel to the top surface of the substrate and intersecting with the first direction.

11. The memory device according to claim 8, wherein the slimming hole is configured to pass through both sidewalls of the trench that face each other in a second direction parallel to the top surface of the substrate and intersecting with the first direction.

12. The memory device according to claim 7, further comprising:
   a plurality of slits passing through a cell region and a slimming region of the electrode structure, and extending in a first direction parallel to a top surface of the substrate to divide the electrode structure,
   wherein the trench and the slimming hole are disposed between two adjacent slits in the slimming region.

* * * * *